United States Patent
Lim et al.

(10) Patent No.: US 10,823,759 B2
(45) Date of Patent: Nov. 3, 2020

(54) TEST SYSTEM AND METHOD OF TESTING A WAFER FOR INTEGRATED CIRCUIT DEVICES

(71) Applicant: Xilinx, Inc., San Jose, CA (US)

(72) Inventors: Lik Huay Lim, Singapore (SG); Andy Widjaja, Singapore (SG); King Yon Lew, Singapore (SG); Mohsen H. Mardi, Saratoga, CA (US); Xuejing Che, Singapore (SG)

(73) Assignee: XILINX, INC., San Jose, CA (US)

( * ) Notice: Subject to any disclaimer, the term of this patent is extended or adjusted under 35 U.S.C. 154(b) by 109 days.

(21) Appl. No.: 16/180,995

(22) Filed: Nov. 5, 2018

(65) Prior Publication Data
US 2020/0141976 A1    May 7, 2020

(51) Int. Cl.
G01R 1/06      (2006.01)
G01R 1/067     (2006.01)
G01R 1/073     (2006.01)

(52) U.S. Cl.
CPC ..... G01R 1/06794 (2013.01); G01R 1/07342 (2013.01)

(58) Field of Classification Search
CPC ........ G01N 27/04; G01N 27/02; G01N 27/06; G01N 33/18; G01N 27/045
USPC .................. 324/693, 600, 649, 691
See application file for complete search history.

(56) References Cited

U.S. PATENT DOCUMENTS

| | | | |
|---|---|---|---|
| 5,083,466 A * | 1/1992 | Holm-Kennedy | G01P 15/0802 73/514.33 |
| 6,617,972 B2 * | 9/2003 | Takarada | G08B 21/0484 340/635 |
| 6,891,384 B2 | 5/2005 | Mardi | |
| 7,180,318 B1 | 2/2007 | Mahoney | |
| 7,235,412 B1 | 6/2007 | Mardi | |
| 7,285,973 B1 | 10/2007 | Mardi | |
| 7,535,239 B1 | 5/2009 | Dang | |
| 7,598,727 B1 | 10/2009 | Dang | |
| 7,737,439 B2 | 6/2010 | Mardi | |
| 7,888,954 B1 | 2/2011 | Mardi | |
| 8,269,518 B1 | 9/2012 | Dang | |
| 8,269,519 B1 | 9/2012 | Mardi | |
| 8,427,249 B1 * | 4/2013 | Swanson | H03H 9/02433 331/154 |
| 8,436,698 B2 * | 5/2013 | Rogers | H03H 7/01 333/186 |
| 8,493,071 B1 | 7/2013 | Mardi | |
| 8,542,029 B1 | 9/2013 | Mardi | |
| 8,659,169 B2 | 2/2014 | Mardi | |

(Continued)

*Primary Examiner* — Giovanni Astacio-Oquendo
(74) *Attorney, Agent, or Firm* — Patterson + Sheridan, LLP

(57) ABSTRACT

A test system for testing a wafer for integrated circuit devices is described. The test system comprises a first plurality of test probes adapted to make electrical contacts to first corresponding contacts of a wafer tested by the test system; a second plurality of test probes adapted to make electrical contacts to second corresponding contacts on a perimeter region of a portion of the wafer tested by the test system; and a control circuit coupled to the first plurality of test probes and the second plurality of test probes; wherein the control circuit determines whether the second plurality of test probes has a proper contact with the wafer based upon signals received by the second plurality of test probes. A method of testing a wafer for an integrated circuit is also described.

20 Claims, 4 Drawing Sheets

(56) References Cited

U.S. PATENT DOCUMENTS

| | | | | |
|---|---|---|---|---|
| 8,779,729 B2* | 7/2014 | Shiraishi | ............... | G06F 1/3212 |
| | | | | 320/155 |
| 2012/0098518 A1* | 4/2012 | Unagami | ............. | G01R 22/066 |
| | | | | 324/74 |

* cited by examiner

TEST SYSTEM AND METHOD OF TESTING A WAFER FOR INTEGRATED CIRCUIT DEVICES

TECHNICAL FIELD

The present invention relates generally to integrated circuit devices, and in particular, to a test system for and a method of testing a wafer for integrated circuit devices.

BACKGROUND

The testing process during the manufacture of an integrated circuit device is important for not only identifying defective integrated circuit dies of a wafer to prevent them from being used in a packaged integrated circuit device, only to fail after being shipped to a customer, but also to ensure that a good wafer is not falsely determined to be defective because of a problem with the test system. According to conventional methods, an open pin test and DC parametric test are carried out using Input/Output (IO) pads. Once the IO pad contacts the probe on the probe card, current will flow and provide measurement values to a tester to indicate whether contacts of the probes are proper contacts that are sufficient to provide a voltage or current value necessary to record a test measurement. However, test probes of a conventional test system do not identify problems associated with planarity of the various elements of the test system.

Accordingly, there is a need for a test system for and methods of testing a wafer of an integrated circuit device that overcomes the problems of conventional testing devices.

SUMMARY

A test system for testing a wafer for integrated circuit devices is described. The test system comprises a first plurality of test probes adapted to make electrical contacts to first corresponding contacts of a wafer tested by the test system; a second plurality of test probes adapted to make electrical contacts to second corresponding contacts on a perimeter region of a portion of the wafer tested by the test system; and a control circuit coupled to the first plurality of test probes and the second plurality of test probes; wherein the control circuit determines whether the second plurality of test probes has a proper contact with the wafer based upon signals received by the second plurality of test probes.

A method of testing a wafer for integrated circuit devices is also described. The method comprises configuring a first plurality of test probes to make electrical contacts to corresponding contacts of a wafer tested by a test system; configuring a second plurality of test probes to make electrical contacts to corresponding contacts on a perimeter region of a portion of the wafer tested by the test system; and coupling a control circuit to the first plurality of test probes and the second plurality of test probes; determining whether the second plurality of test probes has a proper contact with the wafer based upon signals received by the second plurality of test probes.

DETAILED DESCRIPTION

The circuits and methods set forth below position probes, which are used to detect setup problems with a test system for integrated circuit wafers, at the edge of a portion of the wafer, such as at IO, voltage or ground contacts in a perimeter region of the portion of the wafer. The IO, voltage, and ground contacts may be pads of the wafer for example. Many integrated circuit devices may not place IO at the edge of the die, and the power pads at the edge of a die may be limited and often reserved for probing of power pads. However, ground pads may be available at the edge of the die and may be chosen to make contacts with probes to detect problems with the setup of a test system. According to some implementations, probes that are used to detect setup problems with a test system for integrated circuit wafers can be used to perform a DC check, and determine an order that the probes touch corresponding contact pads to determine problems associated with planarity in the test system. The probes can be connected between GND pads that are not used for other testing and the tester. By implementing additional probes that are used to detect problems with a test system for integrated circuit wafers at the edge of dies, better coverage for a planarity check is provided. The testing for planarity with these additional probes can be a part of DC check at the start of a test program. The circuits and methods help identify setup problems due to improper planarity more quickly, reduce down time of the test systems, and lead to a better yield by more accurately identifying misalignment problems, such as planarity problems.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
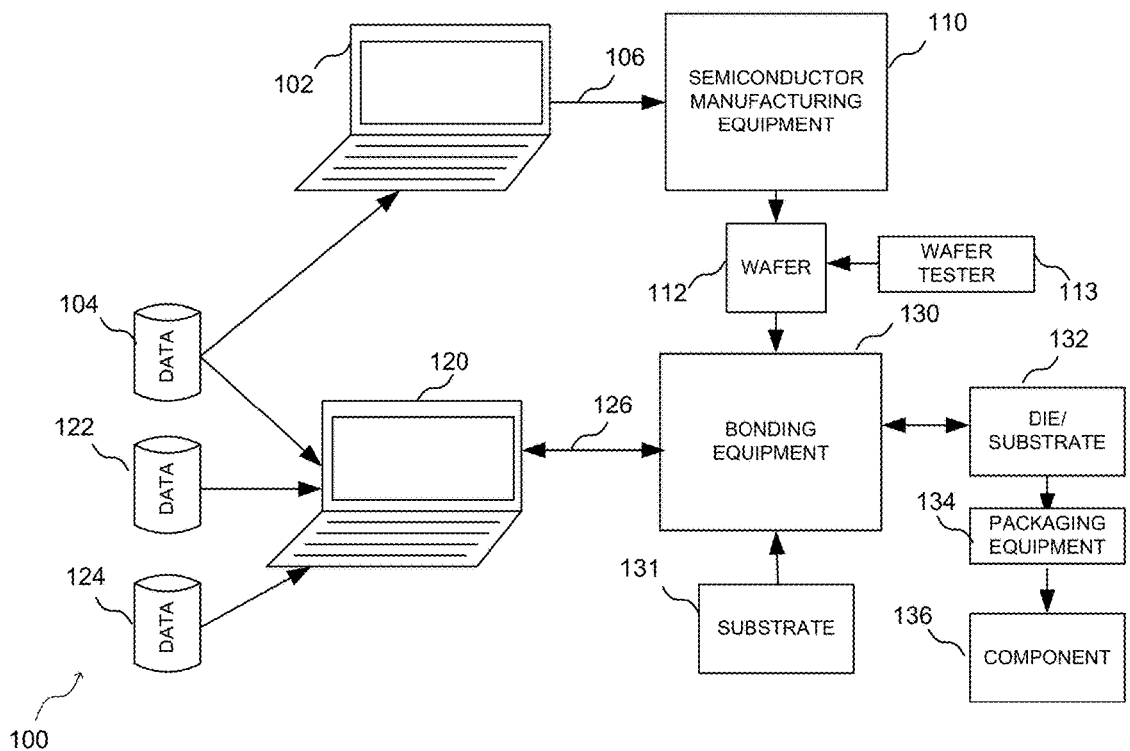
FIG. 1 is a system for producing an integrated circuit device.

Turning first to FIG. 1, a system for producing an integrated circuit device is shown. The system 100 comprises computer-aided design (CAD) equipment 102, which could be any computer adapted to run CAD software. The CAD equipment 102 receives data, such as a master schematic 104 based upon selected values for transistor and interconnect element design, and is coupled by a communication link 106 to semiconductor manufacturing equipment 110. CAD equipment 102 could be used to simulate and determine desired transistor and interconnect element values that improve performance. The semiconductor manufacturing equipment 110 may generate a wafer 112 having a plurality of die, as is well known in the art. A wafer tester 113 may be implemented to test wafers produced by the system before they are packaged in an integrated circuit packaging device. The circuits and methods described in more detail below may be implemented using the wafer tester 113 for example.

CAD equipment 120, which is also coupled to receive the master schematic 104, may receive a bonding diagram 122 and substrate artwork 124. The CAD equipment 120 is coupled by a communication link 126 to bonding equipment 130. The communication links 106 and 126 could be any wired or wireless communication link. The bonding equipment provide wire bonds from a die from the wafer 112 to a substrate 131 receiving the die, or may enable contacts, such as solder bumps between contact pads of the die and corresponding contact pads of the substrate. The bonding equipment may also enable direct chip attach arrangements, die-to-die connections, or other types of connections to contact elements of a die. The die/substrate 132 is coupled to packaging equipment 134 which generates a finished component 136, such as an integrated circuit package. The system of FIG. 1 enables the manufacture of an integrated circuit package according to the various circuits and methods set forth below. Although the system of FIG. 1 provides various elements required for producing an integrated circuit package, it should be understood the elements shown in FIG. 1 could be combined, or additional elements could be provided.

Figure 2:
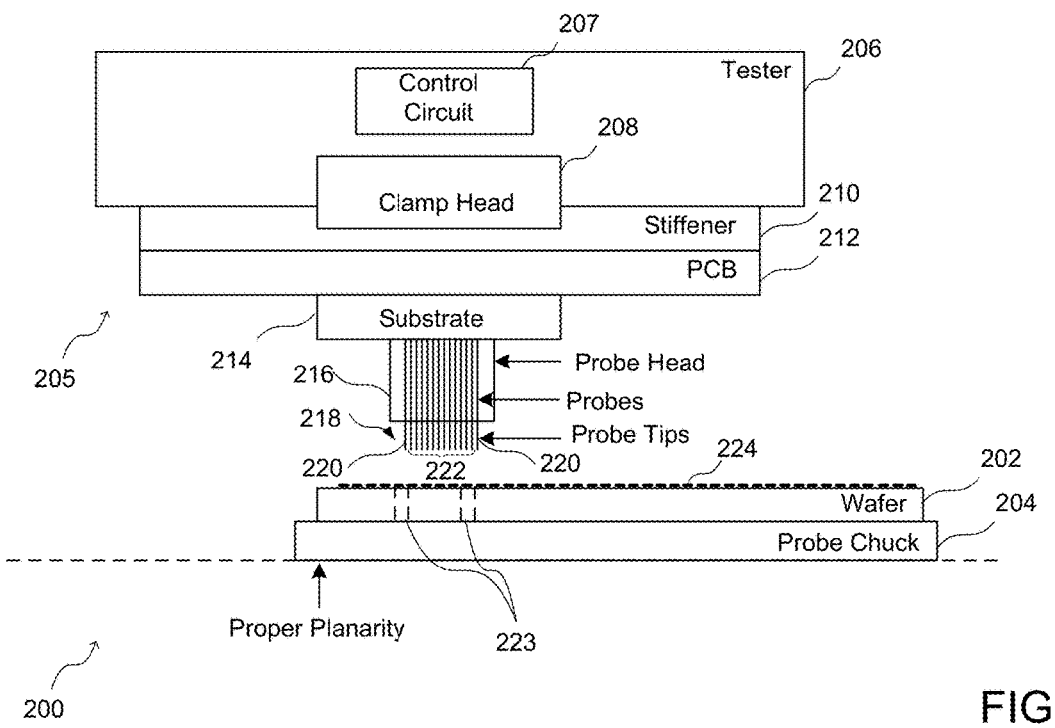
FIG. 2 is a block diagram of a wafer testing portion of the wafer tester of FIG. 1.

Turning now to FIG. 2, a block diagram of a wafer testing portion 200, which may be a part of the wafer testing 113 of the system of FIG. 1, is shown. The wafer testing portion may comprise a test system, or be implemented as a part of a test system for testing wafers. As shown in FIG. 2, a wafer 202 comprises a plurality of die that may be packaged after testing to determine whether the dies should be packaged. The probes on the wafer testing portion 200 are configured to make contact with contact pads 224 of the wafer 202 that is positioned on a probe chuck 204, where the probe and the contact pads of the wafer are aligned to make electrical contacts. The wafer testing portion 200 comprises a stage 205 having a tester 206. A control circuit 207 of the tester is coupled to the probes of the tester to enabling applying signals and detecting voltages or currents that may be used to determine whether there is a proper contact between a probe tip and a contact pad on the wafer. When a proper contact is present, the tester can detect proper contacts, such as by detecting voltages or currents at the contact pads. The control circuit could be any type of circuit or processor for communicating signals to other elements of the wafer testing portion 200 or the wafer tester 113. The control circuit may be a processor implemented in an integrated electronic circuit device such as, for example, a reduced instruction set computer (RISC) processor, a Microprocessor without Interlocked Pipeline Stages (MIPS) processor, a processor implemented in personal computers, or any other processor configured to execute instructions stored in a memory. The control circuit could be implemented in one or more processing devices, such as a central processing unit (CPU) as well as a graphics processing unit (GPU) for example.

The stage 205 further comprises a clamp head 208. A probe card comprises a stiffener 210 and a printed circuit board (PCB) 212 that are coupled between the clamp head 208 and the substrate 214. The stiffener 210 comprises a mechanical structure that acts as a support for the PCB 212 to prevent deformation of the PCB 212. The PCB comprises electrical traces from the tester to the substrate 214, which provides a transformation from larger pad sizes to smaller pad sized used to enable making connections from a probe head 216 to the contact pads 224. The probe head 216 comprises probes 218 extending from the substrate 214 to probe tips that make contacts to contact elements, such as contact pads 224, on the wafer.

Figure 3:
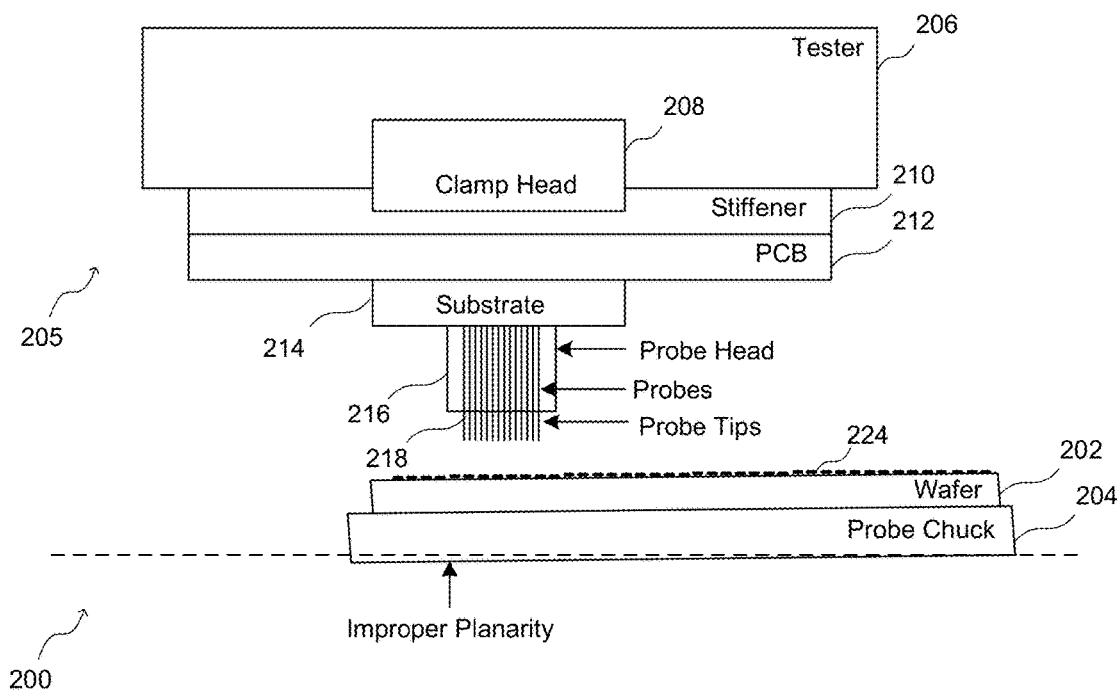
FIG. 3 is a block diagram showing the probe chuck of the wafer testing portion of FIG. 2 having improper planarity.

As shown in FIG. 2, the probes may comprise probes 220 that are positioned in a perimeter region of a portion of the wafer, such as a portion of the wafer associated with a die when the wafer is cut, and are dedicated to testing for setup problems, such as problems with planarity as set forth below in reference to FIGS. 3-5, when the probes are applied to the wafer. As will be described in more detail below, the perimeter region 223 corresponds to a perimeter associated with probes used for detecting setup problems. Other probes 222 may be used to test other aspects of the die when the probes are coupled to contact elements of the die. By way of example, the probes 222 could be used to perform functional testing of the die. Therefore, the elements of the stage 205 enable the control circuit to detect voltages or currents at contact pads for the wafer, and therefore determine whether there is a setup problem with the tester, such as a planarity problem associated with the stage 205, the probe chuck 204, or the probes themselves.

As can be seen in FIG. 2, the two components of the system of FIG. 2 (i.e. the stage 205 and the probe chuck 204) are movable with respect to one another. As a result, it is possible that the probe tips may be misaligned with contact elements of the wafers as described in more detail below, and therefore lead to improper measurements. While the probe chuck 204 and the stage 205 have a proper planarity and are aligned with respect to one another as shown in FIG. 2 (i.e. the plane of the wafer 202 and the plane defined by the tips of the probe 218 are parallel planes), elements of the tester may become misaligned, leading to a planarity problem that causes improper measurements. As shown for example in FIG. 3, the probe chuck 204 of the wafer tester may have an improper planarity (i.e. the wafer and the probe tips are not in the same plane and therefore misaligned). The misalignment may be determined based upon signals detected from the probes, and particularly the probes making contacts to contact elements on the perimeter region of a portion of a wafer associated with a die, as will be described in more detail below.

Figure 4:
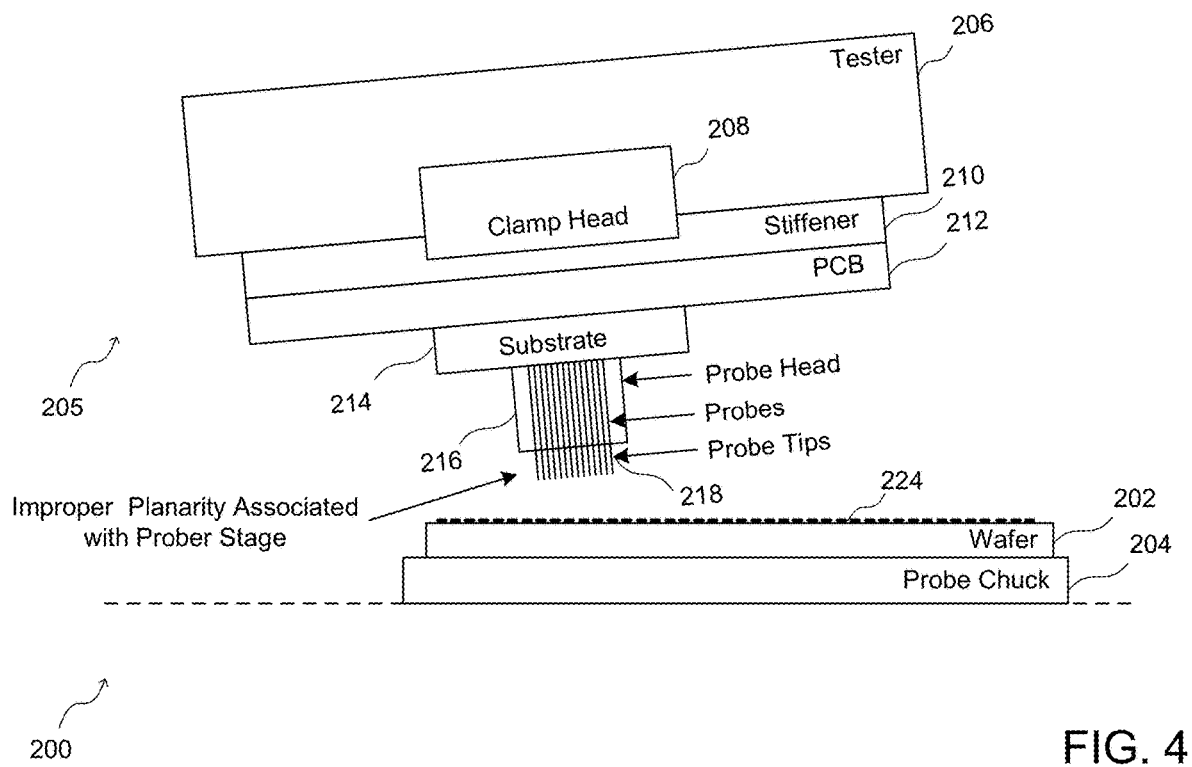
FIG. 4 is a block diagram showing the stage of the wafer testing portion of FIG. 2 having improper planarity.
Figure 5:
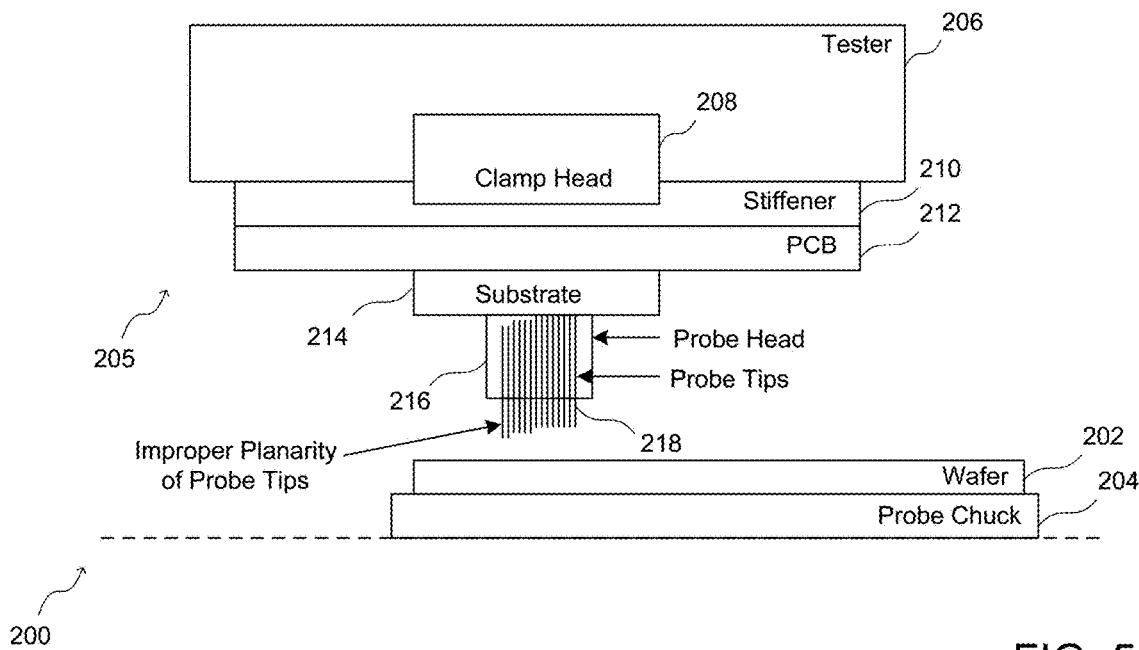
FIG. 5 is a block diagram showing the probe tips of the wafer testing portion of FIG. 2 having improper planarity.

As shown in FIG. 4, the prober stage 205, and therefore the probe tips, have improper planarity with respect to the contact elements of the wafer, leading to potentially bad contacts between the probes and the contact elements (i.e. improper electrical connections between the probe tips and contact elements of the wafer, and therefore potentially erroneous test results). The test system will normally be calibrated to make sure that the probe chuck or the probe stage at all corners are at +/−10 micrometers (um) of specifications. If the chuck or stage needs to be adjusted, for example by 20 um on a given side, then it may be necessary to ensure that both the probe chuck and the probe stage are within the specifications also, usually +/−10 um. According to another misalignment problem as shown in FIG. 5, the probe tips themselves have an improper planarity, indicating a problem with the probe head.

Figure 6:
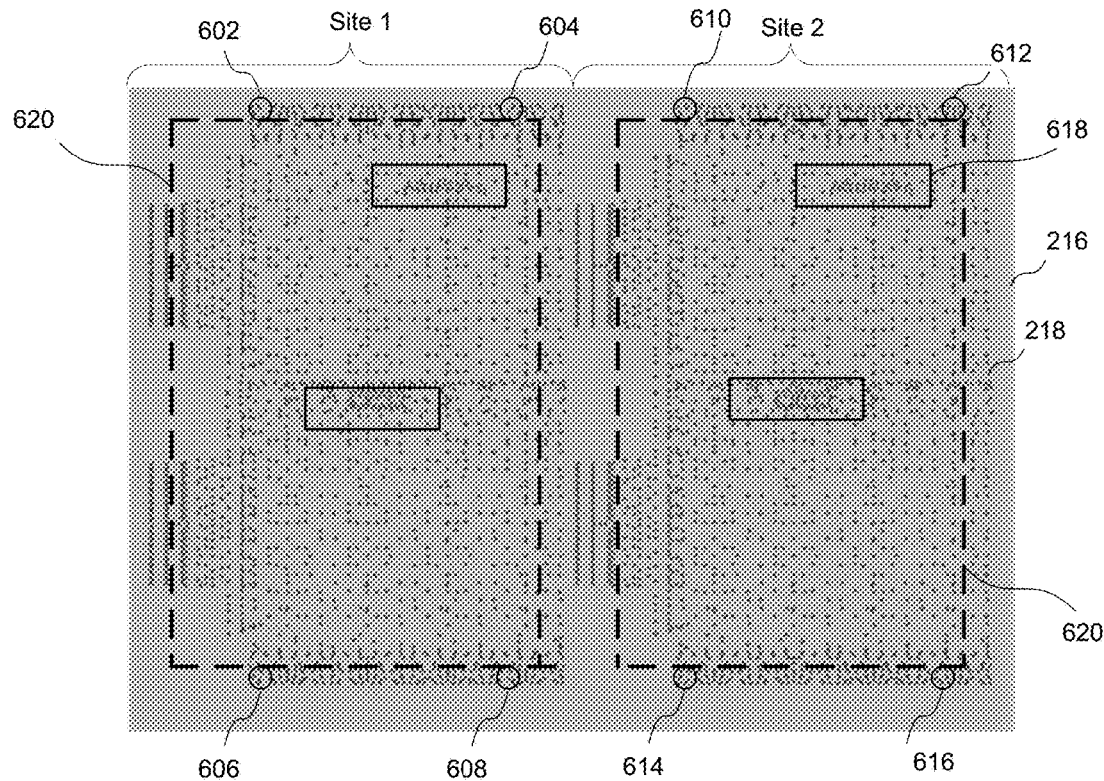
FIG. 6 is a block diagram showing the probes of a probe head having 2 test sites.

Turning now to FIG. 6, a block diagram of a probe head having 2 test sites for 2 dies of a wafer, including a Site 1 for the first die and a Site 2 for a second die, comprising a plurality of probes is shown. The dots of FIG. 2 represent probe tips of a probe head, where certain probe tips may be implemented for purposes of determining planarity of the elements of a tester. For example, one or more probe tips in regions 602, 604, 606 and 608 are used for testing for planarity for Site 1, and one or more probe tips may be implemented in regions 610, 612, 614 and 616 may be implemented for testing the planarity for Site 2. It should be understood that fewer or more regions having probe tips for testing for planarity could be implemented. Other regions 618, shown by the boxes identifying groups of probes that are located outside of the perimeter region (such as perimeter region 223) of the wafer being tested, are used for probing input/output contacts in order to perform testing other than detecting an improper setup, such as functional testing of a circuit on a die of the wafer. A perimeter 620 (shown by the dashed lines and defining a region between the edges of the die and the dashed line) can be defined to include IO, power and ground contacts that are used for additional probes to test for setup problems such as improper planarity, and generally corresponds for each site to the perimeter region 223 of the portion of the wafer being tested. The perimeter 620 may be determined based upon identifying a region having contacts, such as unused ground contacts for example, that would be available for testing for a setup problem. The size of the perimeter region may depend upon the wafer being tested and the location of available contact pads available for planarity testing (e.g. unused ground pads), but is generally near the edge of the portion of the wafer being tested. It should also be noted that, by placing the contact pads that correspond to probes between the edge of the dies and the perimeter 620 (i.e. in the perimeter region of the portion of the die being tested, such as perimeter region 232, where the contact pads that would align with probes between the edge of the die of the wafer being tested and the dashed line defining the perimeter 620), the probes are far apart in the test sited and it is possible to detect an order of the contacts made by the probes with corresponding contact pads to determine information about the misalignment. For example, a first contact pad making a contact with a probe would be a higher level (i.e. closer to the wafer) than a second contact pad making a later contact with a probe. By recording the order that the probes make contact with corresponding contact pads, the orientation of the probes with respect to the contact pads can be determined, enabling a determination that there is misalignment in the system.

Figure 7:
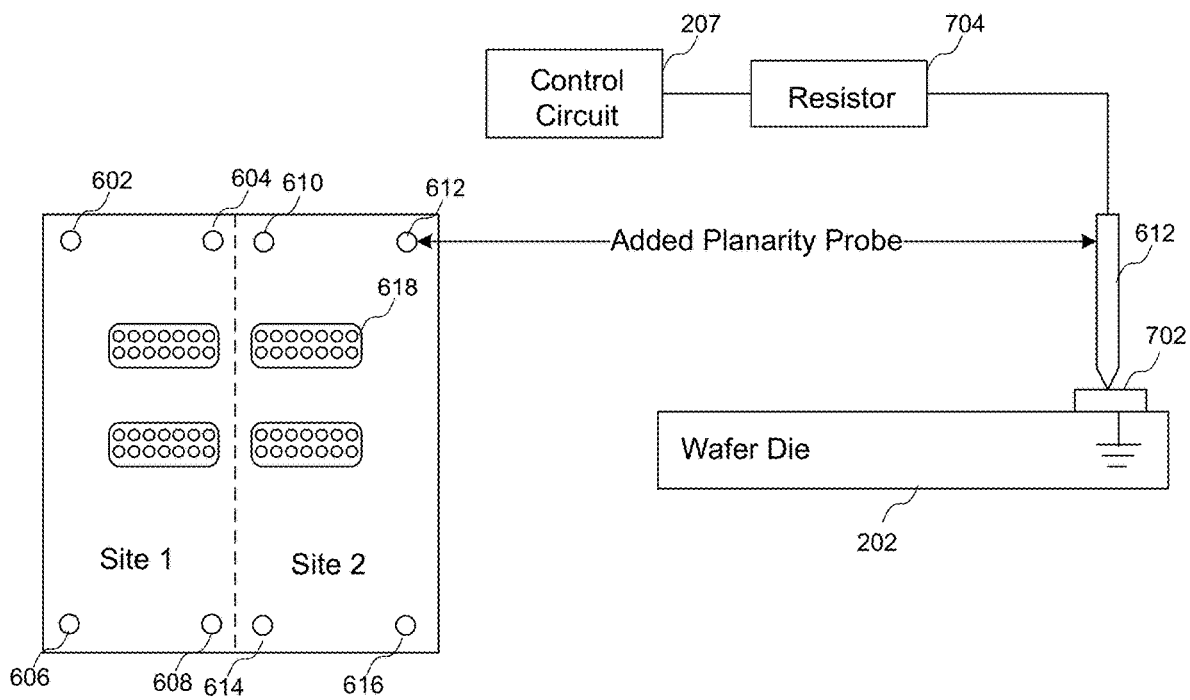
FIG. 7 is a block diagram of test system showing an exemplary test probe in a corner of a test site.

Turning now to FIG. 7, a block diagram of test system shows an exemplary test probe in a corner of a test site. The test system of FIG. 7 may comprise added planarity probes used for identifying setup problems, shown by way of example as probe 612, that is coupled between a ground pad 702 and the control circuit 207 by way of a resistor 704. The ground pad may be for example an unused ground pad (i.e. a ground pad that is not used in other aspects or phases of the wafer testing) in the perimeter region 223. The testing for setup problems, such as problems with planarity, may be performed during a DC test check at the beginning of testing, or at other stages of testing.

According to some implementations, a current source from tester provides a current through resistor 704 as a load and through the probe to the ground pad which will determine open or close pin for pad. If all of the selected pads used for testing for planarity have current going through, this indicate that contacts are good contacts (i.e. proper electrical connections) for all corners of the dies. If there is one probe without current flowing through, this would indicate that the location has bad contact, and it may be necessary to adjust the planarity of the probe stage, the probe chuck or the probe card itself. While probes in the perimeter region of the die may be beneficial in determining problems with planarity, it should be understood that measurements from other probes could be used in conjunction with measurements from the other probes (i.e. probes positioned outside of the perimeter region 232 of the wafer) to identify problems with planarity. While one probe 612 is shown in FIG. 7, this should be understood that all of the other probes used to identify setup problems could be connected in a similar manner between contact pads and the control circuit.

Figure 8:
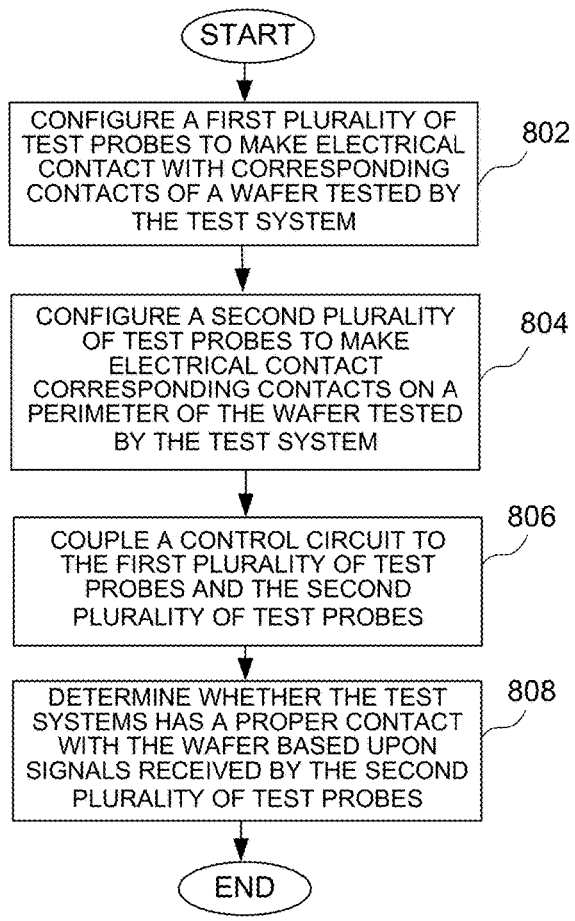
FIG. 8 is a flow diagram showing a method of testing a wafer of an integrated circuit.

Turning now to FIG. 8, a flow diagram showing a method of testing a wafer of an integrated circuit. A first plurality of test probes is configured to make electrical contact with corresponding contacts of a wafer tested by a test system, such as the wafer tester 113 or the test systems of FIG. 4 or 7 for example, at a block 802. A second plurality of test probes is configured to make electrical contact corresponding contacts in a perimeter region of the die tested by the test system at a block 804. The second plurality of probes may the probes 220 on the ends of the test probe that are aligned with contact pads on the perimeter of the portion of the wafer that is tested, and the first plurality of probes may be other probes, such as probes 222 for example for performing functional testing. A control circuit, such as control circuit 207, is coupled to the first plurality of test probes and the second plurality of test probes at a block 806. It is determined whether the test system has a proper contact with the wafer based upon signals received by the second plurality of test probes at a block 808.

According to one implementation, the first plurality of test probes may be configured to make electrical contact with corresponding input/output contacts of a wafer tested by the test system, where the input/output contacts are located outside of a perimeter region of the wafer being tested (i.e. within the perimeter 620 of a site of the probe head). The second first plurality of test probes may be configured to make electrical contact with corresponding reference contacts of a wafer tested by the test system, and more particularly unused ground contacts. A DC check at a start of a test program may be performed to identify an alignment problem. According to some implementations, an order of contacts made by the second plurality of test probes may be determined, wherein the order of contacts is used to determine whether a portion of the system at an angle. Determining whether a portion of the system is at an angle may comprise determining whether a probe chuck is at an angle, the probe stage is at an angle, or the probe tips have improper planarity.

The method of FIG. 8 may be implemented using the circuits of FIGS. 1-7 as described, or may be implemented using other suitable circuits. While specific elements of the method are described, it should be understood that additional elements of the method, or additional details related to the elements, could be implemented according to the disclosure of FIGS. 1-7.

It can therefore be appreciated that new systems for and methods of testing a wafer in an integrated circuit have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A test system for testing a wafer for integrated circuit devices, the test system comprising:

a first plurality of test probes adapted to make electrical contacts to first corresponding contacts of a wafer tested by the test system;
a second plurality of test probes adapted to make electrical contacts to second corresponding contacts on a perimeter region of a portion of the wafer tested by the test system; and
a control circuit coupled to the first plurality of test probes and the second plurality of test probes;
wherein the control circuit determines whether the second plurality of test probes has a proper contact with the wafer based upon signals received by the second plurality of test probes.

2. The test system of claim 1, wherein the first plurality of test probes is adapted to make the electrical contacts with corresponding input/output contacts of the wafer tested by the test system.

3. The test system of claim 2, wherein the input/output contacts are located outside of the perimeter region of the portion of the wafer tested by the test system.

4. The test system of claim 1, wherein the second plurality of test probes is adapted to make the electrical contacts with corresponding reference contacts within the perimeter region of the portion of the wafer tested by the test system.

5. The test system of claim 4, wherein the reference contacts comprise unused ground contacts associated with one or more die of the wafer.

6. The test system of claim 1, wherein control circuit determines an order in which the electrical contacts to the second corresponding contacts is made by the second plurality of test probes, wherein the order in which the electrical contacts is made is used to determine whether a portion of the test system is misaligned.

7. The test system of claim 6, wherein a detection of a first contact pad making a contact with a first probe indicating a first level of the wafer with respect to the first probe before a detection of a second contact pad making a contact with a second probe indicating a second level of the wafer with respect to the second probe is used to determine that a portion of the test system is misaligned.

8. The test system of claim 7, wherein determining whether a portion of the test system is misaligned comprises determining whether a probe chuck or a probe stage is misaligned.

9. The test system of claim 7, wherein determining whether a portion of the test system is misaligned comprises determining whether the second plurality of probes has improper planarity.

10. The test system of claim 1, wherein determining whether the second plurality of test probes has a proper contact with the wafer based upon signals received by the second plurality of test probes comprises determining whether there is improper planarity in the test system.

11. A method of testing a wafer for integrated circuit devices, the method comprising:
probing a wafer using a test system, the test system including:
a first plurality of test probes adapted to make electrical contacts to corresponding contacts of the wafer;
a second plurality of test probes adapted to make electrical contacts to corresponding contacts on a perimeter region of a portion of the wafer; and
a control circuit coupled to the first plurality of test probes and the second plurality of test probes; and
determining, by the control circuit, whether the second plurality of test probes has a proper contact with the wafer during the probing of the wafer by the test system based upon signals received by the second plurality of test probes.

12. The method of claim 11, wherein the first plurality of test probes is configured to make the electrical contacts with corresponding input/output contacts of the wafer tested by the test system.

13. The method of claim 12, wherein the input/output contacts are located outside the perimeter region of the portion of the wafer tested by the test system.

14. The method of claim 11, wherein the second plurality of test probes is configured to make the electrical contacts with corresponding reference contacts within the perimeter region of the portion of the wafer tested by the test system.

15. The method of claim 14, wherein the reference contacts comprise unused ground contacts associated with one or more die of the wafer.

16. The method of claim 11, further comprising determining an order in which electrical contacts to the corresponding contacts is made by the second plurality of test probes, wherein the order in which the electrical contacts is made is used to determine whether a portion of the test system is misaligned.

17. The method of claim 16, wherein a detection of a first contact pad making a contact with a first probe indicating a first level of the wafer with respect to the first probe before a detection of a second contact pad making a contact with a second probe indicating a second level of the wafer with respect to the second probe is used to determine that a portion of the test system is misaligned.

18. The method of claim 17, wherein determining whether a portion of the test system is misaligned comprises determining whether a probe chuck or a probe stage is misaligned.

19. The method of claim 17, wherein determining whether a portion of the test system is misaligned comprises determining whether the second plurality of probes has improper planarity.

20. The method of claim 11, wherein determining whether the second plurality of test probes has the proper contact with the wafer based upon signals received by the second plurality of test probes comprises determining whether there is improper planarity in the test system.

* * * * *